(12) United States Patent
Hanai et al.

(10) Patent No.: US 11,360,145 B2
(45) Date of Patent: Jun. 14, 2022

(54) RELAY FAULT DIAGNOSIS DEVICE

(71) Applicant: DENSO WAVE INCORPORATED, Chita-gun (JP)

(72) Inventors: Takashi Hanai, Chita-gun (JP); Takaaki Maekawa, Chita-gun (JP); Takeru Morishita, Chita-gun (JP)

(73) Assignee: DENSO WAVE INCORPORATED, Chita-gun (JP)

( * ) Notice: Subject to any disclaimer, the term of this patent is extended or adjusted under 35 U.S.C. 154(b) by 387 days.

(21) Appl. No.: 16/543,749

(22) Filed: Aug. 19, 2019

(65) Prior Publication Data

US 2020/0096571 A1 Mar. 26, 2020

(30) Foreign Application Priority Data

Sep. 21, 2018 (JP) .............................. JP2018-177396

(51) Int. Cl.
*G01R 31/327* (2006.01)
*H01H 47/00* (2006.01)
*G01R 31/50* (2020.01)

(52) U.S. Cl.
CPC ......... *G01R 31/3278* (2013.01); *G01R 31/50* (2020.01); *H01H 47/004* (2013.01)

(58) Field of Classification Search
CPC . G01R 1/00; H01H 1/00; H01H 45/00; H01H 63/00; H01H 69/00; H01H 2201/00; H01H 2203/00
See application file for complete search history.

(56) References Cited

U.S. PATENT DOCUMENTS

| 2003/0132752 | A1* | 7/2003 | Johnson | G01R 31/3278 324/418 |
| 2007/0205771 | A1* | 9/2007 | Drake | G01R 31/3278 324/418 |
| 2009/0212975 | A1* | 8/2009 | Ausman | H03K 17/18 340/945 |
| 2010/0302696 | A1 | 12/2010 | Yamada et al. | |
| 2015/0028877 | A1* | 1/2015 | McCormick | H01H 50/00 324/418 |
| 2015/0170860 | A1* | 6/2015 | Ahmed | H01H 47/22 361/187 |
| 2015/0179377 | A1* | 6/2015 | Han | H01H 9/0271 307/125 |
| 2016/0225561 | A1 | 8/2016 | Fukumoto et al. | |

FOREIGN PATENT DOCUMENTS

| JP | S52-122455 A | 10/1977 |
| JP | H05-55435 U | 7/1993 |
| JP | 5319400 B2 | 10/2013 |
| JP | 2016-143563 A | 8/2016 |

* cited by examiner

*Primary Examiner* — Jermele M Hollington
*Assistant Examiner* — Temilade S Rhodes-Vivour
(74) *Attorney, Agent, or Firm* — Harness, Dickey & Pierce, P.L.C.

(57) ABSTRACT

A relay fault diagnosis device includes: at least one C-contact relay that has a common terminal, a normally open terminal and a normally closed terminal; a read-back circuit that is connected to the normally closed terminal of the relay; and a diagnostic section that outputs a test signal to the common terminal to diagnose a fault in the relay.

4 Claims, 4 Drawing Sheets

NORMAL

RELAY: OFF

RELAY: ON

FAULTY

SHORT-CIRCUITING BETWEEN NO-NC

RELAY: OFF

RELAY: ON

NO-SIDE WELDING

RELAY: OFF/ON

NC-SIDE WELDING

RELAY: OFF/ON

TEST SIGNAL (ST)

NORMAL

RELAY: OFF    SM

RELAY: ON     SM

SHORT-CIRCUITING BETWEEN NO-NC

RELAY: OFF    SM

RELAY: ON     SM

NO-SIDE WELDING

RELAY: OFF/ON    SM

NC-SIDE WELDING

RELAY: OFF/ON    SM

RELAY FAULT DIAGNOSIS DEVICE

CROSS REFERENCE TO RELATED APPLICATIONS

The present application claims the benefit of priority from Japanese Patent Application No. 2018-177396 filed on Sep. 21, 2018. The entire disclosures of all of the above applications are incorporated herein by reference.

TECHNICAL FIELD

The present disclosure relates to a fault diagnosis device that diagnoses relay faults.

BACKGROUND

A relay is used in industrial appliances for switching a connection path between a power supply and a load, for example. To ensure reliable and safe switching of the connection path, a fault in the relay may be detected. An abnormality detection device that detects a fault in the relay has been known.

SUMMARY

The present disclosure describes a relay fault diagnosis device ma include: at least one C-contact relay that has a common terminal, a normally open terminal and a normally closed terminal; a read-back circuit that is connected to the normally closed terminal of the relay; and a diagnostic section that outputs a test signal to the common terminal to diagnose a fault in the relay.

BRIEF DESCRIPTION OF DRAWINGS

Features and advantages of the present disclosure will become more apparent from the following detailed description with reference to the accompanying drawings. In the drawings.

DETAILED DESCRIPTION

Figure 1:
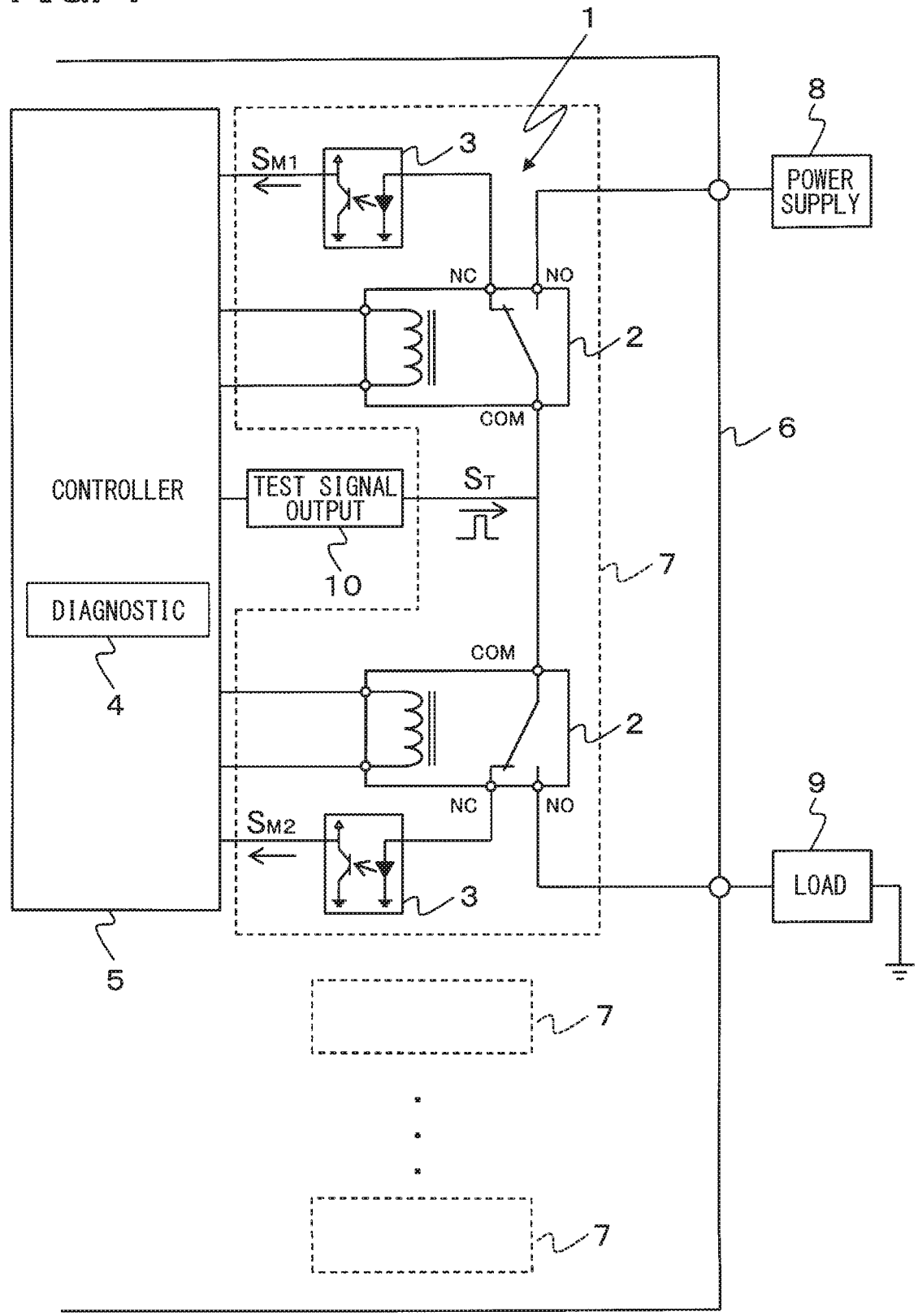
FIG. 1 is a schematic diagram showing a configuration of a fault diagnosis device according to one embodiment.

One safety measure for relays is the use of a type of relays known as safety relays having a mechanism with forcibly guided contacts, which is a feature that physically prevents a normally open terminal (NO) and a normally closed terminal (NC) from being closed at the same time. With the use of such a safety relay, an abnormality in the relay may be detected by monitoring the statuses of the normally open terminal (NO) and the normally closed terminal (NC).

Because of their built-in physical feature, a safety relay tends to have a larger size than general-purpose C-contact relays with equal rating. An industrial appliance such as a programmable logic controller (referred to as a PLC) that requires switching among multiple channels needs multiple safety relays, which leads to an increase in substrate size. PLCs, in particular, require double relays for ensuring safety and may well cause the substrate to be larger. This makes it difficult to simply adopt a safety relay in the circuit configuration.

Industrial appliances equipped with, not just safety relays but any relays, need a circuit for diagnosing relay faults. A complex circuit configuration on the other hand increases the mounting area and leads to enlarge a size. It is may be desirable to be able to detect faults in relays with a circuit configuration that is as simple as possible.

The present disclosure provides a fault diagnosis device capable of diagnosing a fault in a relay without further complication of the diagnostic circuit configuration.

According to one aspect of the present disclosure, a relay fault diagnosis device may include: at least one C-contact relay that has a common terminal, a normally open terminal connected to the common terminal when the relay is activated, and a normally closed terminal, the normally open terminal and the common terminal breaking and connecting a path of electricity to be supplied to a load; a read-back circuit that is connected to the normally closed terminal of the relay, and is configured to output a monitoring signal of an H-level or L-level in accordance with a sink current from the normally closed terminal; and a diagnostic section that is configured to output a test signal to the common terminal of the relay to diagnose a fault in the relay by comparing the test signal output and the monitoring signal output from the read-back circuit.

The waveform of the test signal (also referred to as a diagnostic signal) input to the relay, and appearing at the normally open terminal and the normally closed terminal, can be identified based on the ON/OFF state of the relay. If the relay is normal and is not faulty, the waveforms of the signals appearing at the normally open terminal and the normally closed terminal will be in accordance with the test signal. Therefore, it can be determined whether the relay is faulty by monitoring the waveforms of the signals appearing at the normally open terminal and the normally closed terminal.

By comparing the output test signal and the observed monitoring signal, i.e., by determining whether a monitoring signal expected to be observed if the relay is normal is being output from the read-back circuit, it may be possible to detect a fault in the relay.

The read-back circuit only needs to output a binary signal in accordance with the waveform observed at respective terminals, which enables adoption of a simplified circuit configuration. Since general-purpose C-contact relays can be employed, there is no need to use relatively larger relays such as safety relays.

Accordingly, it may be possible to diagnose relay faults without further complication of the diagnostic circuit configuration.

Furthermore, the diagnostic section may output the test signal to diagnose the fault in the relay while the common terminal and the normally closed terminal are connected.

Generally, it is unlikely that relays fail frequently in normal use, and most relay diagnosis is expected to produce a result indicating that the relay is normal. In other words, the test signal output for checking the relay will likely also flow through the power supply path including the normally operating relay, and other devices or circuits connected to the signal path.

Depending on the configuration or status of other devices or circuits, there is a possibility that the test signal itself may adversely affect them as noise. Diagnosing a relay fault by outputting the test signal with the common terminal and the normally closed terminal being connected can prevent possible malfunctioning, due to the test signal, of other devices connected to the path.

Furthermore, the diagnostic section may output the test signal while switching on and off the relay, and specifies a type of the fault of the relay.

Examples of faults expected to occur in relays include short-circuiting between the normally open terminal and the normally closed terminal, welding of the normally open terminal, and welding of the normally closed terminal. With the relay being switched on and off, the output monitoring signal will have different waveforms depending on the types of faults such as short-circuiting between the normally open terminal and the normally closed terminal, welding of the normally open terminal, and welding of the normally closed terminal, because of the connection path not being switched correctly, and because the connection path changes depending on the type of the fault. Therefore, it may be possible to specify the type of the fault occurring in the relay by comparing the test signal and the observed monitoring signal in consideration of the ON/OFF state of the relay. It may also be possible to determine whether the relay is faulty by inputting the test signal while the relay is switched on and off.

Furthermore, the relay may include multiple relays, and the diagnostic section may output the test signal to the plurality of relays, in common.

Since there need only be one test signal to be output even if there are multiple relays, it may be possible to prevent the diagnostic circuit configuration from becoming complex.

Furthermore, the read-back circuit may be a photocoupler.

As the read-back circuit can be configured by a single component, for example, the diagnostic circuit configuration can be prevented from becoming complex. This is particularly advantageous for PLCs, which carry contact circuits of multiple channels and require multiple, for example, two, relays for each channel for safety.

One embodiment will be described below with reference to FIG. 1 to FIG. 4.

As shown in FIG. 1, a fault diagnosis device 1 includes a relay 2, a read-back circuit 3, a controller 5 that includes a diagnostic section 4, and the like. The fault diagnosis device 1 of the present embodiment is mounted on an IO module substrate 6 of a programmable logic controller (PLC). The IO module substrate 6 carries contact circuits 7 of multiple channels, the contact circuit 7 of one channel including two relays 2 each, with a read-back circuit 3 provided to each relay.

Figure 2:
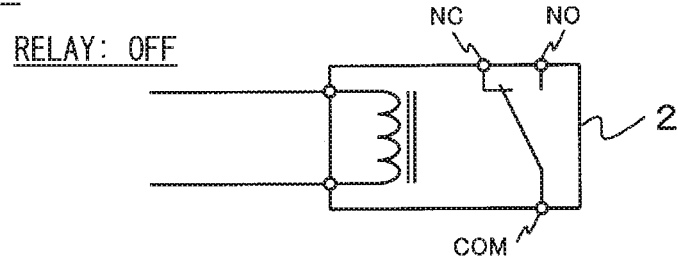
FIG. 2 is a schematic diagram showing how a relay normally works.
Figure 2:
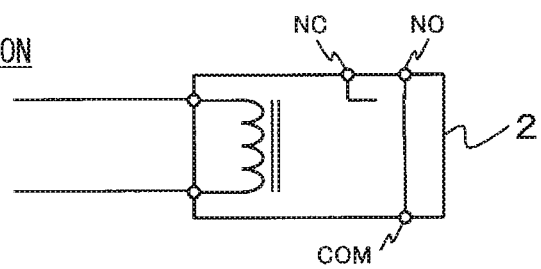

The relay 2 includes, as shown in FIG. 2 in detail, a normally open terminal (NO) that is normally electrically not connected with a common terminal (COM), and a normally closed terminal (NC) that is normally electrically connected to the common terminal (COM). The normally open terminal (NO) and the common terminal (COM) break and connect the path of electricity to be supplied to a load. The relay 2 is not a safety relay but a general-purpose C-contact relay. Incidentally, the common terminal may be referred to as a common contact, the normally open terminal may be referred to as a normally open contact, and the normally closed terminal may be referred to as a normal closed contact.

The state where the common terminal (COM) and the normally open terminal (NO) are electrically connected will be referred to as ON, and the state where the common terminal (COM) and the normally closed terminal (NC) are electrically connected will be referred to as OFF. When the relay 2 is referred to as being "ON", it shall mean that the common terminal (COM) and the normally open terminal (NO) are electrically connected.

In the present embodiment, as shown in FIG. 1, two relays 2 are provided in the power supply path between an external power supply device 8 and an external load 9. In a PLC, a redundant power supply path is required to ensure safety. The fault diagnosis device 1 itself does not necessarily require two relays 2.

In one of the two relays 2 disposed closer to the power supply device 8, the normally open terminal (NO) is connected to the power supply device 8, and the common terminal (COM) is connected to the common terminal (COM) of the other relay 2 disposed closer to the load 9. These relays 2 operate in sync with each other based on instructions from the controller 5. When the relay 2 closer to the power supply device 8 is turned on, the relay 2 closer to the load 9 is turned on, too. When the relay 2 closer to the power supply device 8 is turned off, the relay 2 closer to the load 9 is turned off, too.

A read-back circuit 3 is connected to each of the relays 2. The read-back circuit 3 is configured by a photocoupler that is a single component, its input terminal, i.e., an anode of the diode, is connected to the normally closed terminal (NC) of the relay 2, and a cathode of the diode is connected to a ground potential. The read-back circuit 3 outputs a monitoring signal (SM) from the emitter of the output-side transistor. The monitoring signal (SM) is a voltage signal output at H level (corresponding to a high level signal) or L level (corresponding to a low level signal) in accordance with a sink current from the normally closed terminal (NC). Herein, the H level is higher than a predetermined voltage, and the L level is lower than the predetermined voltage, for example.

A test signal (ST) is input to the common terminal (COM) of the relay 2. In the present embodiment, the test signal (ST) is input to the relay 2 via a test signal output circuit 10 that amplifies the signal output from the controller 5. This is for enabling a common test signal (ST) to be output to contact circuits 7 of multiple channels, which are mounted on the 10 module substrate 6. Alternative configurations are also possible, i.e., a test signal (ST) may be output to one channel or several channels each, or, the test signal output circuit 10 may be omitted. The test signal output circuit 10 may be referred to as a diagnosis signal output circuit.

The controller 5 is configured by a microcomputer, and outputs a drive signal for driving the relays 2. The controller 5 is a controller provided for controlling the IO module. The controller 5 includes a diagnostic section 4 that checks the relays 2 in conjunction with the present embodiment. The diagnostic section 4 compares the test signal (ST) with the monitoring signal (SM) output from the read-back circuit 3 and detects a fault in the relay 2 or determines whether the relay 2 is faulty, i.e., checks the relays 2. The microcomputer may be referred to as a microcontroller, a microprocessor.

The power supply device 8 supplies DC power or AC power depending on the type of the load 9. Any appliance such as a motor, a lamp, or the like may be selected as the load 9.

Example of effects of the configuration described above will be explained.

As mentioned above, it may be required that a fault in relays 2 be detected for industrial appliances, for example in order to ensure reliable and safe switching of the connection path between the power supply and the load 9. In addition to a further size reduction, PLCs require double relays 2 for safety, and therefore, the diagnostic circuit must be a simple one. In the present embodiment, general-purpose C-contact relays 2 are employed for size reduction, and the relays 2 are checked by inputting a test signal (ST) to the relays 2 and receiving a monitoring signal (SM) from the read-back circuits 3.

More specifically, in a normal state, as shown in FIG. 2, when the relays 2 are off, the normally closed terminal (NC) and the common terminal (COM) are electrically connected, and when the relays 2 are on, the normally open terminal (NO) and the common terminal (COM) are electrically connected.

In such a relay 2, faults such as short circuiting between the normally closed terminal (NC) and the normally open terminal (NO), welding of the normally closed terminal (NC), and welding of the normally open terminal (NO) are expected to occur.

Figure 3:
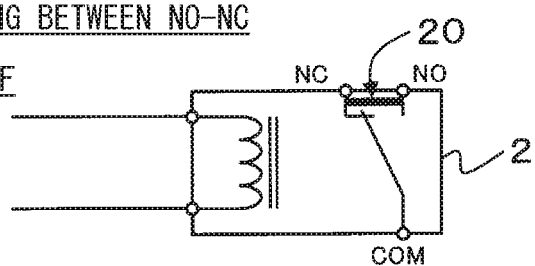
FIG. 3 is a schematic diagram showing how a relay works when faulty.
Figure 3:
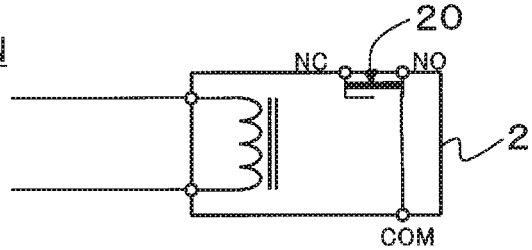
Figure 3:
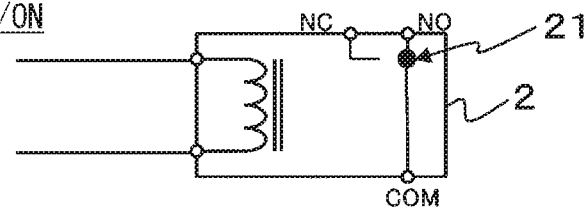
Figure 3:
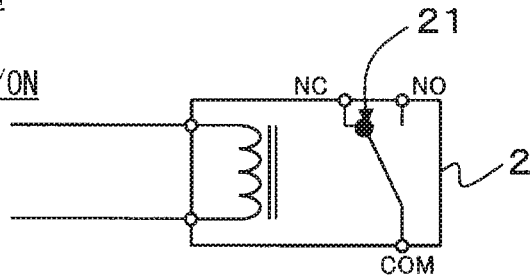

It is considered that short circuiting between the normally closed terminal (NC) and the normally open terminal (NO) may occur if there are metallic flakes or powder present between the terminals inside the relay 2. If this is the case, as shown in FIG. 3 as "short-circuiting between NO-NC", the normally closed terminal (NC) and the normally open terminal (NO) are electrically connected by a conductive piece 20 or the like irrespective of whether the relay 2 is on or off.

Welding of the normally open terminal (NO) is assumed to occur when an overcurrent flows through when the relay 2 is turned on. Here, a movable terminal incapable of moving due to a fault in the driver of the movable terminal is also determined as a case of welding of the normally open terminal (NO). If this is the case, as shown in FIG. 3 as "NO-side welding", the contact point between the movable terminal and the normally open terminal (NO) becomes a welded part 21, so that, irrespective of whether the relay 2 is on or off, the movable terminal cannot be separated from the normally open terminal (NO).

Welding of the normally closed terminal (NC) is assumed to occur when the movable terminal inseparably sticks to the normally closed terminal (NC) for some reason, or when the movable terminal is unable to move due to a fault in the driver of the movable terminal. In this case, as shown in FIG. 3 as "NC-side welding", the contact point between the movable terminal and the normally closed terminal (NC) becomes a welded part 21, so that, irrespective of whether the relay 2 is on or off, the movable terminal cannot be separated from the normally closed terminal (NC).

Figure 4:
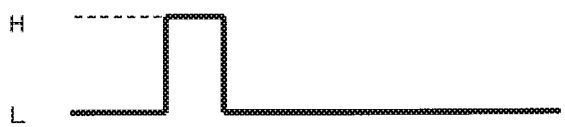
FIG. 4 is a schematic diagram showing a test signal (ST) and a monitoring signal (SM) in comparison.
Figure 4:
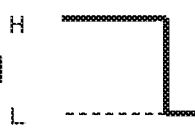
Figure 4:
Figure 4:
Figure 4:
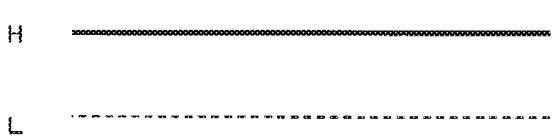
Figure 4:
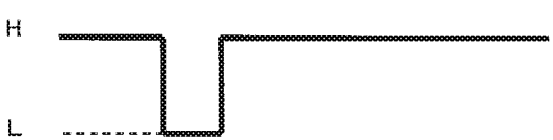

When a test signal (ST) is input to such a relay 2, the monitoring signal (SM) output from the read-back circuit 3 will differ depending on the type of the fault. More specifically, as shown in FIG. 4, when a test signal in the form of pulses is input to the relay 2, if the relay 2 is normal and turned off, the common terminal (COM) and the normally closed terminal (NC) are electrically connected, so that pulses of the opposite-polarity waveform will be observed as the monitoring signal (SM) in sync with the test signal (ST). The polarity inversion is due to the configuration of the read-back circuit 3. If the circuit configuration is of the type which produces the same polarity, the resultant monitoring signal (SM) will have the same polarity.

If the relay 2 is normal and turned on, the common terminal (COM) and the normally open terminal (NO) are electrically connected. In other words, since the normally closed terminal (NC) is open, the pulses of the input test signal (ST) will not be observed in the monitoring signal (SM). When the relay is normal, the output monitoring signal (SM) differs depending on the ON/OFF state of the relay 2, and pulses will be observed when the relay 2 is turned off.

If the normally closed terminal (NC) and the normally open terminal (NO) are short-circuited, the power supply voltage of the power supply device 8 is constantly applied to the normally closed terminal (NC). Therefore, irrespective of whether the relay 2 is on or off, the pulses of the input test signal (ST) will not be observed in the monitoring signal (SM). The output signal will be constantly at L level.

If the normally open terminal (NO) is welded, the normally closed terminal (NC) will stay open whether the relay 2 is turned on or off. Therefore, irrespective of whether the relay 2 is on or off, the pulses of the input test signal (ST) will not be observed in the monitoring signal (SM). The output signal will be constantly at H level.

If the normally closed terminal (NC) is welded, the normally closed terminal (NC) and the common terminal (COM) will stay connected whether the relay 2 is turned on or off, and the power supply voltage is not applied to NC. Therefore, irrespective of whether the relay 2 is on or off, opposite-polarity pulses will be observed in the monitoring signal (SM) in sync with the test signal (ST).

In this way, a monitoring signal (SM) different from that when the relay is normal is observed at the fault diagnosis device 1 when there is a fault in the relay 2. The monitoring signal differs also depending on the type of the fault.

Therefore, it may be possible to detect a fault by comparing the input test signal (ST) with the observed monitoring signal (SM), i.e., by determining whether the monitoring signal (SM) expected to be observed if the relay is normal is being output from the read-back circuit 3. The type of the fault can also be specified by switching on and off the relay 2. Also, it may be possible to determine whether the relay is faulty by inputting the test signal (ST) while the relay 2 is switched on and off.

According to the embodiment described above, the following effects may be attained for example.

The fault diagnosis device 1 for the relay 2 includes a relay 2 having a normally open terminal (NO) that is normally electrically not connected to a common terminal (COM), and a normally closed terminal (NC) that is normally electrically connected to the common terminal (COM), the normally open terminal (NO) and the common terminal (COM) breaking and connecting a path of electricity to be supplied to a load 9, a read-back circuit 3 connected to the normally closed terminal (NC) of the relay 2 for outputting an H-level or L-level monitoring signal (SM) in accordance with a sink current from the normally closed terminal (NC), and a diagnostic section 4 that outputs a test signal (ST) to the common terminal (COM) of the relay 2 to diagnose a fault in the relay 2 by comparing the output test signal (ST) and a monitoring signal (SM) output from the read-back circuit 3.

The waveform of the monitoring signal (SM) that is observed when the relay is normal can be identified from the test signal (ST) input to the common terminal (COM). Therefore, it may be possible to detect a fault by comparing the output test signal (ST) with the observed monitoring signal (SM), i.e., by determining whether the monitoring signal (SM) expected to be observed if the relay is normal is being output from the read-back circuit 3.

The read-back circuit 3 only needs to output a binary signal in accordance with the waveform observed at respective terminals, which enables adoption of a simplified circuit configuration. Since a general-purpose C-contact relay can be employed as the relay 2, there is no need to use relatively larger relays such as safety relays. This does not contradict the intention of avoiding use of safety relays for the sake of space economy.

Accordingly, it may be possible to diagnose faults in the relay 2 without complication of the diagnostic circuit configuration.

The diagnostic section 4 that outputs the test signal (ST) and observes the monitoring signal (SM) to diagnose a fault may be realized by software installed in the controller 5 that is initially provided to the IO module, i.e., there is no need to provide a dedicated microcomputer so that the fault diagnosis device 1 can be made small. Incidentally, the controller 5 may include a not-shown memory (corresponding to a computer readable non-transitory storage medium) that stores the software.

The diagnostic section 4 outputs the test signal (ST) while switching on and off the relay 2 to specify a type of fault of the relay 2. As mentioned above, when any of short circuiting between the normally closed terminal (NC) and the normally open terminal (NO), welding of the normally closed terminal (NC), and welding of the normally open terminal (NO) occurs, the waveform of the observed monitoring signal (SM) will differ depending on the type of the fault. Therefore, the type of the fault can also be specified by taking into consideration the ON/OFF state of the relay 2. Also, it can be determined whether the relay is faulty by inputting the test signal (ST) while the relay 2 is switched on and off. Incidentally, the diagnostic section 4 may switches on and off the relay.

There are provided the multiple relays 2, and the diagnostic section 4 outputs a common test signal (ST) to the multiple relays 2. Thus, further complication of the diagnostic circuit configuration can be avoided even when the multiple relays 2 are mounted.

The read-back circuit 3 is configured by a photocoupler. Thus, as the read-back circuit 3 can be configured by a single component, for example, the diagnostic circuit configuration can be prevented from becoming complex. This may be advantageous for PLCs, which carry contact circuits 7 of multiple channels and require multiple, for example, two, relays 2 for each channel for safety.

It has been described in the embodiment above that faults of the relay 2 can be diagnosed when the relay 2 is activated, i.e., when the common terminal (COM) and the normally open terminal (NO) are connected, and when the relay is not activated, i.e., when the common terminal (COM) and the normally closed terminal (NC) are connected. Alternatively, faults in the relay 2 may be diagnosed by outputting the test signal (ST) in a state where the common terminal (COM) and the normally closed terminal (NC) are connected, i.e., when no power is being supplied to the load 9.

Generally, it may be unlikely that relays 2 fail frequently in normal use, and most relay diagnosis is expected to produce a result indicating that the relay 2 is normal. In other words, the test signal (ST) output to check the relay will likely also flow through the power supply path including the normally operating relay, and other devices or circuits connected to the signal path. Depending on the configuration or status of other devices or circuits, there is a possibility that the test signal (ST) itself may adversely affect them as noise.

Diagnosing relay faults by outputting the test signal with the common terminal and the normally closed terminal being connected can prevent the test signal (ST) from being fed to the power supply device 8 or the load 9, or prevent the test signal (ST) from adversely affecting peripheral circuits when the relay 2 is activated, i.e., under normal control, which in turn prevents possible malfunctioning of other devices such as the PLC in which the fault diagnosis device 1 is provided.

While various embodiments, configurations, and aspects of a relay fault diagnosis device according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A relay fault diagnosis device comprising:
at least one C-contact relay that has a common terminal, a normally open terminal connected to the common terminal when the relay is activated, and a normally closed terminal, the normally open terminal and the common terminal breaking and connecting a path of electricity to be supplied to a load;
a read-back circuit that is connected to the normally closed terminal of the relay, and is configured to output a monitoring signal of an H-level or L-level in accordance with a sink current from the normally closed terminal, the read-back circuit outputting the monitoring signal of ground potential when an input terminal of the read-back circuit is in an open state; and
a diagnostic section that is configured to output a test signal to the common terminal of the relay to diagnose a fault in the relay by comparing the test signal output and the monitoring signal output from the read-back circuit,
wherein
the diagnostic section outputs the test signal corresponding to an instruction for switching on state and off state of the relay, and specifies whether the fault occurs in the relay and specifies a type of the fault when the fault is occurred in the relay,
in a case where the instruction for turning off the relay and the instruction for turning on the relay are input to the relay, in response to the monitoring signal corresponding to the test signal being observed, the diagnostic section determines the type of fault as a welding of the normally closed terminal,
in a case where the instruction for turning off the relay and the instruction for turning on the relay are input to the relay, in response to the monitoring signal corresponding to the ground potential, the diagnostic section determines the type of fault as a welding of the normally open terminal, and
in a case where the instruction for turning off the relay and the instruction for turning on the relay are input to the relay, in response to the monitoring signal corresponding to a power supply voltage applied to the normally open terminal, the diagnostic section determines the type of fault as a short circuit between the normally open terminal and the normally closed terminal.

2. The relay fault diagnosis device according to claim 1, wherein:
the relay includes a plurality of relays; and
the diagnostic section outputs the test signal to the plurality of relays, in common.

3. The relay fault diagnosis device according to claim 1, wherein:
the read-back circuit includes a photocoupler.

4. The relay fault diagnosis device according to claim 1, wherein:
the diagnostic section switches on and off the relay and outputs the test signal to the common terminal;

the diagnostic section specifies a type of the fault of the relay in accordance with a result of comparison by the diagnostic section; and the type of the fault includes a short-circuiting between the normally closed terminal and the normally open terminal, welding at the normally open terminal, and welding at the normally closed terminal.

\* \* \* \* \*